(12) United States Patent
Al-Amoody et al.

(10) Patent No.: US 9,577,066 B1
(45) Date of Patent: Feb. 21, 2017

(54) METHODS OF FORMING FINS WITH DIFFERENT FIN HEIGHTS

(71) Applicant: GLOBALFOUNDRIES Inc., Grand Cayman (KY)

(72) Inventors: Fuad Al-Amoody, Rexford, NY (US); Jinping Liu, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/054,314

(22) Filed: Feb. 26, 2016

(51) Int. Cl.
*H01L 29/66* (2006.01)
*H01L 21/8234* (2006.01)

(52) U.S. Cl.
CPC . *H01L 29/66537* (2013.01); *H01L 21/823412* (2013.01); *H01L 21/823431* (2013.01)

(58) Field of Classification Search
CPC .................. H01L 29/66537; H01L 21/823412; H01L 21/823431
USPC ......................................................... 438/276
See application file for complete search history.

(56) References Cited

U.S. PATENT DOCUMENTS

| | | | |
|---|---|---|---|
| 6,909,147 B2 | 6/2005 | Aller et al. | |
| 7,902,035 B2 | 3/2011 | Yu et al. | |
| 8,659,097 B2 | 2/2014 | Mor et al. | |
| 9,048,259 B2 | 6/2015 | Hung et al. | |
| 2008/0096334 A1* | 4/2008 | Kobayashi | ...... H01L 21/823412 438/157 |
| 2015/0200260 A1* | 7/2015 | Yu | ......................... H01L 29/401 438/509 |

* cited by examiner

*Primary Examiner* — Yasser A Abdelaziez
(74) *Attorney, Agent, or Firm* — Amerson Law Firm, PLLC

(57) ABSTRACT

One illustrative method disclosed herein includes, among other things, forming first and second fins, forming a liner layer above at least a first upper surface of the first fin and a second upper surface of the second fin, and forming an ion-containing region in the first portion of the liner layer while not forming the ion-containing region in second portion of the liner layer. The method also includes performing a liner etching process so as to remove the second portion of the liner layer while leaving at least a portion of the first portion of the liner layer positioned above the first fin, and performing at least one etching process to define a reduced-height second fin that is less than an initial first height of the first fin.

23 Claims, 5 Drawing Sheets

METHODS OF FORMING FINS WITH DIFFERENT FIN HEIGHTS

BACKGROUND OF THE INVENTION

1. Field of the Invention

Generally, the present disclosure relates to the manufacture of FinFET semiconductor devices, and, more specifically, to various novel methods of forming fins with different fin heights.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

In contrast to a planar FET, which, as the name implies, is a generally planar structure, a so-called FinFET device has a three-dimensional (3D) structure. FIG. 1 is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes three illustrative fins 14, a gate insulating layer 11, a gate electrode 16, a sidewall spacer 18 and a gate cap 20. A plurality of fin-formation trenches 13 is formed in the substrate 12 to define the fins 14. A recessed layer of insulating material 17 is positioned between the fins 14 and under the gate electrode 16. The overall gate structure is typically comprised of the layer of gate insulating material 11, e.g., a layer of high-k insulating material (k-value of 10 or greater) or silicon dioxide, and one or more conductive material layers (e.g., metal and/or polysilicon) that serve as the gate electrode 16 for the device 10. The fins 14 have a three-dimensional configuration: an exposed height 14H (above the recessed upper surface 17S of the layer of insulating material), a width W and an axial length L. The axial length L corresponds to the direction of current travel in the device 10 when it is operational, i.e., the gate length direction of the device 10. The portions of the fins 14 covered by the gate structure constitute the channel region of the FinFET device 10. The gate structures for such FinFET devices 10 may be manufactured using so-called "gate-first" or "replacement gate" (gate-last) manufacturing techniques. A FinFET device may have either a tri-gate or dual-gate channel region.

In an integrated circuit device, there are different performance requirements for different functional blocks or regions of the device. It is useful to provide transistors, including FinFET transistors, with different threshold voltages to adapt to the different performance requirements. For example, in some cases, devices may be classified as a regular threshold voltage (RVT) device or a super low threshold voltage (SLVT) device. The actual threshold voltage levels associated with the RVT and SLVT devices may vary depending upon the devices under construction and ongoing advances in device design and manufacturing. In one illustrative example, based upon current-day technologies, an RVT device may be considered to be one having a threshold voltage that falls within the range of about 250-350 mV, such as 300 mV, while an SLVT device may be considered to be a device having a threshold voltage that falls within the range of about 100-200 mV, such as 150 mV. In relative terms, the threshold voltage of the RVT device may be about 150 mV greater than the threshold voltage of the SLVT device.

Generally, threshold voltages may be provided by providing different work function materials in the gate electrode, doping the gate dielectric material or the channel regions of the FinFET device by various implantation processes, etc. However, providing different work function materials in the different regions significantly complicates the process flow. The effectiveness of doping processes can also be affected by the channel length of the transistor devices and the thermal budget. High temperature anneal processes performed to activate implanted dopant material and repair damage to the crystalline structure of the substrate can cause difficulties with diffusion of dopant or stress-inducing ions, stress relaxation and defect generation.

The present disclosure is directed to methods of forming fins with different fin heights that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming fins for FinFET devices wherein the fins have different fin heights. One illustrative method disclosed herein includes, among other things, forming first and second fins, forming a liner layer around at least a portion of each of the first and second fins, wherein a first portion of the liner layer is positioned above a first upper surface of the first fin and a second portion of the liner layer is positioned above a second upper surface of the second fin, and forming an ion-containing region in the first portion of the liner layer while not forming the ion-containing region in the second portion of the liner layer. In this example, the method also includes performing a liner etching process on the first and second portions of the liner layer so as to remove the second portion of the liner layer while leaving at least a portion of the first portion of the liner layer positioned above the first upper surface of the first fin, and with the first portion of the liner layer positioned above the first upper surface of the first fin, performing at least one etching process to define a reduced-height second fin that has a reduced height that is less than an initial first height of the first fin.

BRIEF DESCRIPTION OF THE DRAWINGS

The disclosure may be understood by reference to the following description taken in conjunction with the accompanying drawings, in which like reference numerals identify like elements, and in which.

Figure 1:
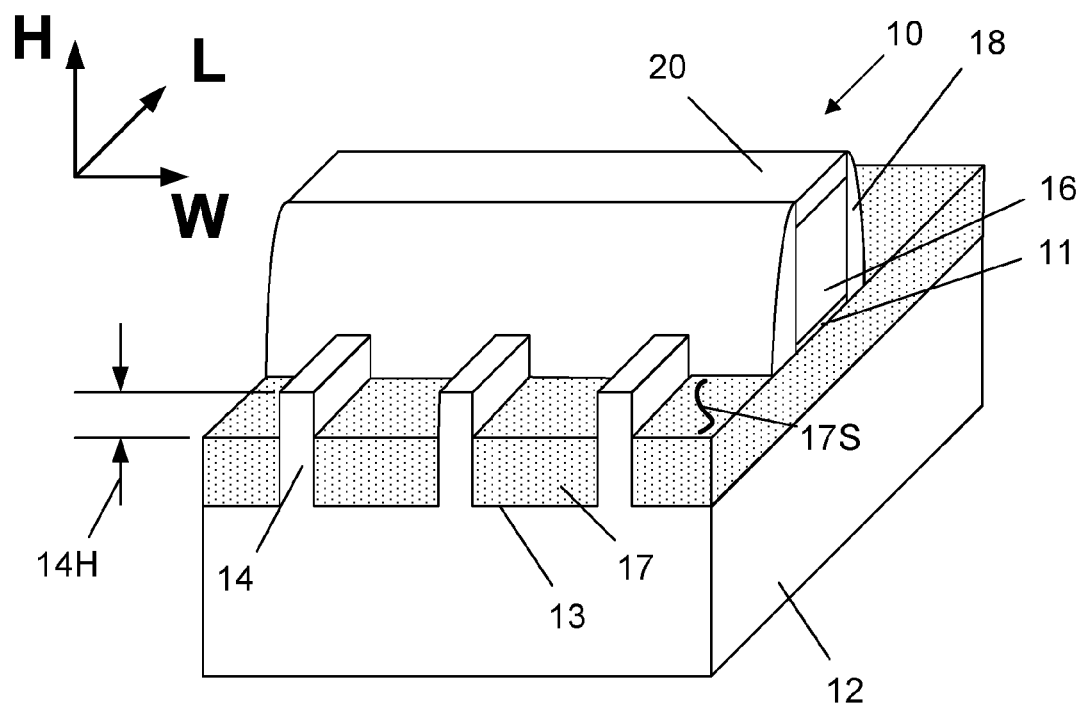
FIG. 1 depicts an illustrative prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different integrated circuit products, including, but not limited to, logic products, memory products, etc., and the devices formed on such products may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 2A-2I depict various illustrative novel methods disclosed herein for forming fins for FinFET devices wherein the fins will have different fin heights. The product 100 shown in these drawings only depicts three illustrative fins 106A-C (collectively referenced using the number 106). These drawings depict a cross-sectional view of an integrated circuit product 100 comprised of one or more FinFET devices during the fabrication process so as to explain some aspects of the various methods disclosed herein. Of course, a real-world IC product may contain any number of fins 106. More specifically, the cross-sectional view depicted in these drawings is taken through fins in a direction that is parallel to a gate width direction (GW) of the completed FinFET devices, i.e., in a direction that is transverse to the long axis of the fins 106.

In the examples depicted herein, the product 100 will be formed in and above a semiconductor substrate 102. The substrate 102 may have a variety of configurations, such as a silicon-on-insulator (SOI) or silicon-germanium-on-insulator (SGOI) that includes a bulk semiconductor layer, a buried insulation layer and an active layer. Alternatively, the substrate may have a simple bulk configuration. The substrate 102 may be made of silicon or it may be made of materials other than silicon. Thus, the terms "substrate" or "semiconductor substrate" should be understood to cover all semiconducting materials and all forms of such materials.

Figure 2A:
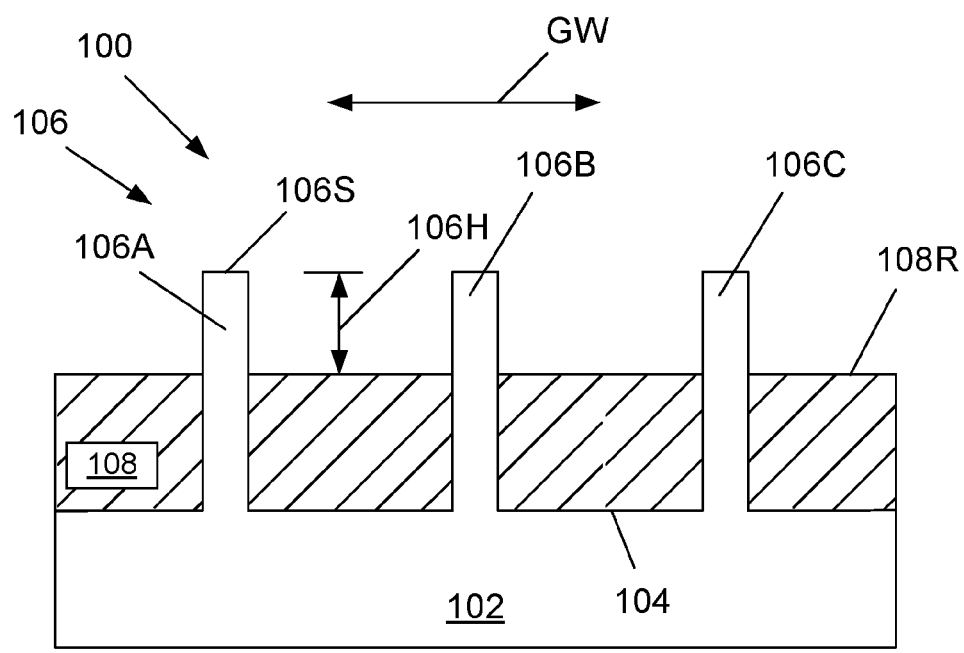
FIGS. 2A-2I depict various illustrative novel methods disclosed herein for forming fins with different fin heights.

FIG. 2A depicts the product 100 at a point in fabrication wherein several process operations have been performed. First, a patterned etch mask (not shown), e.g., a combination of a silicon dioxide layer (e.g., a pad oxide) and a silicon nitride layer (e.g., a pad nitride), was formed above the substrate 102. In some cases, the pad oxide layer (not separately shown) may be omitted if desired. Thereafter, one or more etching processes were performed through the patterned etch mask so as to define a plurality of fin-formation trenches 104 in the substrate 102. This results in the formation of the fins 106 defined from the substrate material. The overall size, shape and configuration of the fins 106 may vary depending on the particular application. In the illustrative examples depicted in the attached figures, the fins 106 will be simplistically depicted as having generally rectangular portions and sections. In an actual real-world device, the fins 106 may be somewhat outwardly tapered (wider at a bottom of the fin 106 that at the top of the fin 106), although that configuration is not depicted in the drawings. Thus, the size and configuration of the fins 106, and the manner in which they are made, should not be considered a limitation of the present invention. For ease of disclosure, only the substantially rectangular-shaped fins 106 having a substantially rectangular-shaped cross-sectional configuration will be depicted in the drawings.

Next, with continuing reference to FIG. 2A, a layer of insulating material 108 was formed so as to over-fill the trenches 104 between the fins 106. The layer of insulating material 108 may be comprised of, for example, silicon dioxide, a HARP oxide, HDP oxide, flowable oxide, etc. Thereafter, one or more chemical mechanical planarization (CMP) processes were performed to remove portions of the layer of insulating material 108 and the patterned hard mask layer (not shown). These processes result in the layer of insulating material 108 having a polished surface that is substantially planar with the upper surface 106S of the fins 106. Then, a timed, recess etching process was performed to remove a portion of the layer of insulating material 108. The recess etching process was performed for a sufficient duration such that the layer of insulating material 108 has a recessed upper surface 108R that is positioned at a desired height level within the trenches 104. This recess etching process exposes an initial fin height 106H of the fins 106 that is substantially uniform for all of the fins 106A-C. In one embodiment, using current day technology, the fin height 106H may be on the order of about 30-60 nm.

Figure 2B:
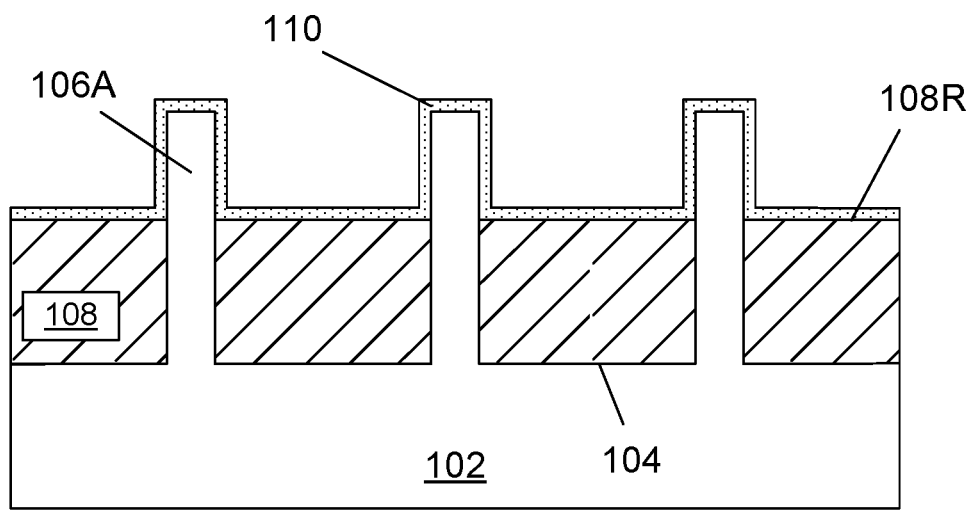

FIG. 2B depicts the product 100 after a relatively thin liner layer 110 was formed above the product 100 depicted in FIG. 2A by performing a conformal deposition process, e.g., ALD, CVD. In one illustrative embodiment, the liner layer 110 may be comprised of a variety of different materials, e.g., silicon dioxide, silicon nitride, silicon oxynitride, etc. The thickness of the liner layer 110 may vary depending upon the particular application, e.g., 2-5 nm. In one particular embodiment, the liner layer 110 may be formed on and in contact with the upper surfaces of the fins 106 and on and in contact with opposing sidewall surfaces of the fins 106.

Figure 2C:
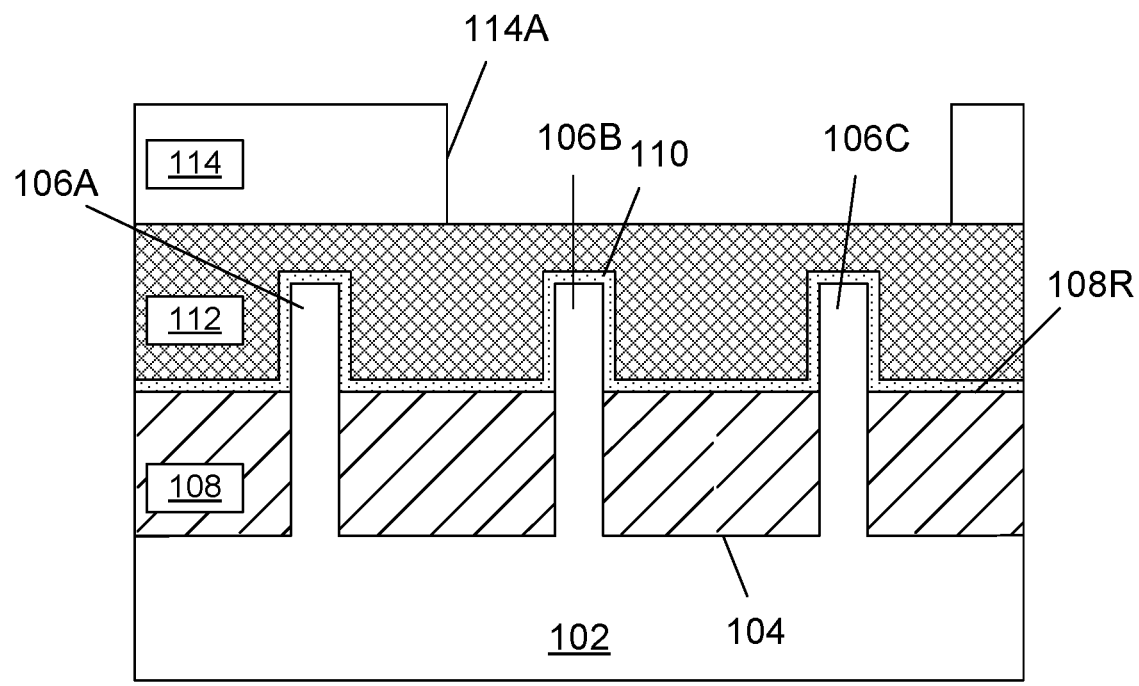

FIG. 2C depicts the product 100 after several process operations were performed. First, a layer of masking material 112 was formed on the product 100 so as to overfill the trenches 104. Thereafter, a patterned etch mask layer 114 was formed above the layer of masking material 112. The patterned etch mask 114 comprises an opening 114A that exposes an area above the fins 106B, 106C while the fin 106A is covered by the patterned etch mask 114. The layer of masking material 112 may be made of a variety of different materials, e.g., a spin-on hard mask (SOH), OPL, or a hard mask material that may be selectively etched relative to the material of the liner layer 110. The patterned etch mask 114 may comprise a patterned layer of photoresist material and it may be formed by using known photolithography tool and techniques.

Figure 2D:
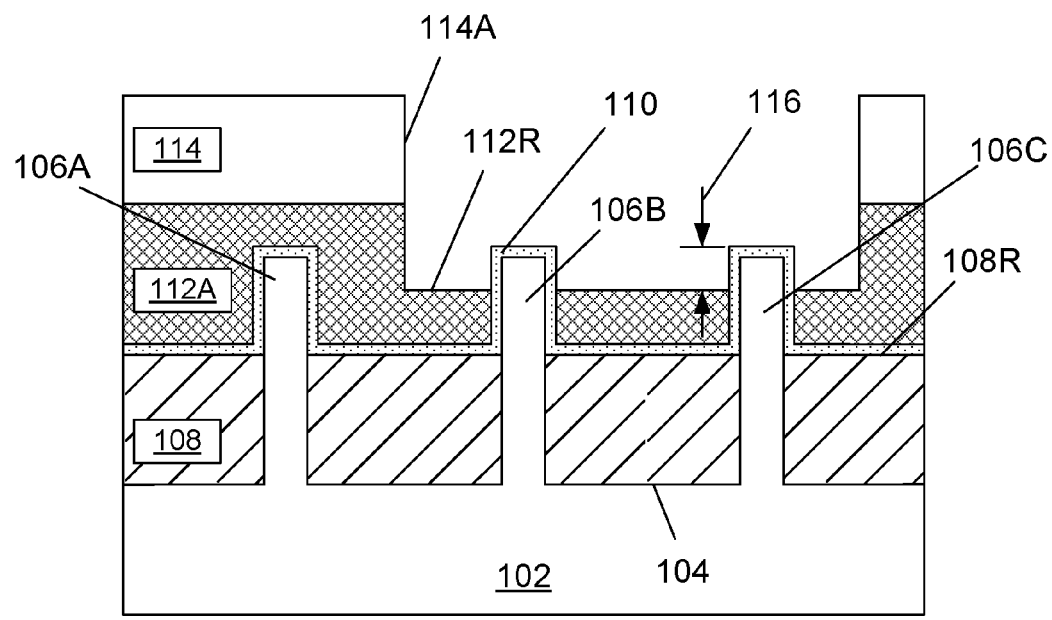

FIG. 2D depicts the product 100 after a timed, recess etching process was performed through the patterned etch mask 114 so as to remove portions of the layer of masking material 112 and thereby define a recessed masking layer 112A with a recessed upper surface 112R. The recessed upper surface 112R of the recessed masking layer 112A may be positioned at a distance 116 below the upper surface of the liner layer 110. The magnitude of the distance 116 may vary depending upon the particular application, e.g., in one illustrative embodiment, the distance 116 may be about 1-3 times the thickness of the liner layer 110.

Figure 2E:
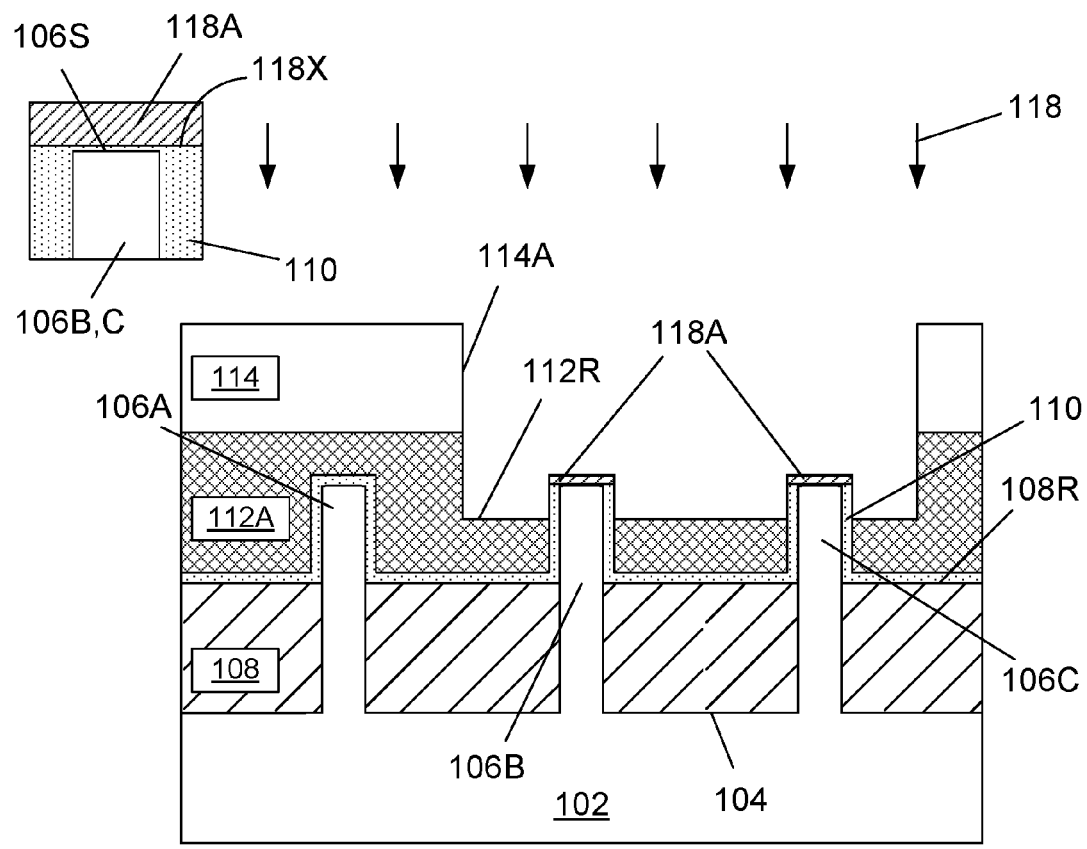

FIG. 2E depicts the product 100 after an ion-introduction process operation 118 was performed on the product 100 to introduce ions into portions of the liner layer 110 positioned above the upper surfaces 106S of the exposed fins 106B, 106C. More specifically, performing the ion-introduction process operation 118 results in the formation of an ion-containing region 118A in portions of the liner layer 110 positioned above the upper surfaces 106S of the fins 106B, 106C, while such an ion-containing region 118A (at the same concentration level) is not formed in other portions of the liner layer 110, and particularly not above the portion of the liner layer 110 positioned above and around the fin 106A which is masked during the ion-introduction process operation 118. The ion-introduction process operation 118 may be either an ion-implant process or a plasma-based process. The ions introduced during the ion-introduction process 118 may vary depending upon the particular applications, e.g., silicon, carbon, germanium, fluorine, chlorine, etc., and the concentration of ions in the ion-containing region 118A may also vary depending upon the particular application, e.g., $4 \times 10^2$ ion/cm$^3$. The ultimate purpose of forming the ion-containing region 118A is to alter or change the etching characteristics of the affected portions of the liner layer 110. More specifically, by selectively forming the ion-containing region 118A only in the portions of the liner layer 110 positioned above the upper surfaces 106S of the fins 106B, 106C, those affected regions will etch at a slower rate than portions of the liner layer 110 that do not contain such ion-containing implant regions 118A. As noted above, the portion of the liner layer 110 positioned around the fin 106A is covered by the recessed masking layer 112A during the ion-introduction process operation 118.

In the example depicted in FIG. 2E, the ion-introduction process operation 118 may be a substantially vertical ion implantation process that was performed to form the ion-containing region 118A in the portions of the liner layer 110 positioned above the upper surfaces 106S of the fins 106B, 106C. Any ions that might be implanted into the recessed masking layer 112A during the ion implantation process are not depicted so as to not obscure the inventions disclosed herein. In one illustrative example, depending upon factors such as the thickness of the liner layer 110, the ion implantation process may be performed using silicon at a dopant dose of about $1 \times 10^{16}$ ions/cm$^2$ and at an energy level of about 0.2-1 keV. With reference to the upper left of FIG. 2E, an enlarged portion of the fins 106B, 106C is depicted. As shown, the ion implantation process was designed such that a bottom surface 118X of the ion-containing region 118A does not extend to the upper surface 106S of the fins 106B, 106C, i.e., the ion-containing region 118A does not extend into the fins 106B, 106C.

FIG. 2E also represents the product 100 wherein the ion-introduction process operation 118 may be a plasma-based ion introduction process that is performed to form the ion-containing regions 118A. Depending upon factors such as the thickness of the liner layer 110, the duration, temperature and energy of the plasma-based ion introduction process may vary. As before, in the depicted example, the plasma-based ion introduction process was designed such that the bottom surface 118X of the ion-containing region 118A does not extend to the upper surface 106S of the fins 106B, 106C.

Figure 2F:
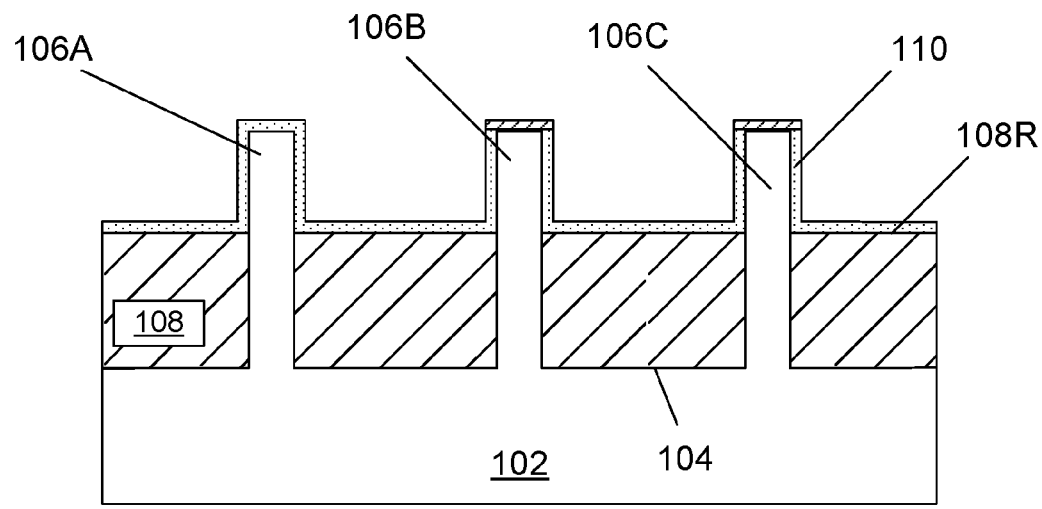

FIG. 2F depicts the product 100 after the patterned etch mask 114 and the recessed masking layer 112A were removed from the product 100 by performing any of a variety of techniques depending upon the material of the patterned etch mask 114 and the recessed masking layer 112A. For example, in the case where the recessed masking layer 112A is made of SOH, a chemical stripping process was performed to remove the recessed masking layer 112A.

Figure 2G:
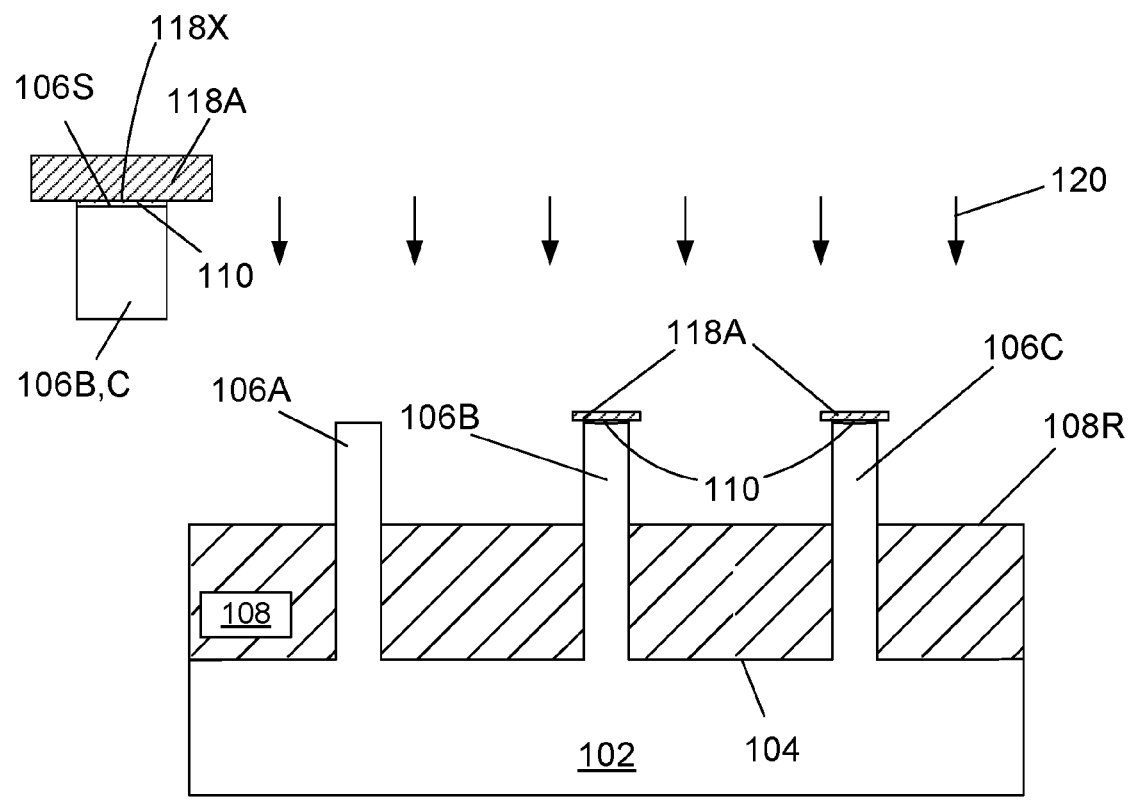

FIG. 2G depicts the product 100 after a liner etching process was performed on the liner layer 110. In one example, where the liner layer 110 is made of silicon dioxide, the etching process may be a dilute HF acid cleaning process. Importantly, the liner etching process removes the portions of the liner layer 110 where the ion-containing regions 118A are not present at a faster rate than it removes the portions of the liner layer 110 positioned above the upper surfaces 106S of the fins 106B, 106C that include the ion-containing regions 118A. Although it may vary depending upon a variety of factors, e.g., the material of the liner layer 110 and the concentration of ions in the ion-containing region 118A, the portions of the liner layer 110 that include the ion-containing regions 118A may etch at a rate that is at least about 4000-5000% slower than that of the portions of the liner layer 110 where the ion-containing regions 118A are not present. For example, if the portions of the liner layer 110 where the ion-containing regions 118A are not present etches at a rate of 5 Å/sec, then the portions of the liner layer 110 positioned above the upper surfaces 106S of the fins 106B, 106C that include the ion-containing regions 118A may have an etch rate on the order of about 0.1 Å/sec. As a result of this etch-differential, after this liner etching process is performed, at least a portion of the liner layer 110 with the ion-containing region 118A remains positioned above at least the upper surfaces of the fins 106B, 106C, while the liner layer 110 located above the fin 106A is removed. With reference to the upper left of FIG. 2G, in one illustrative embodiment, at the completion of the liner etching process, a portion of the liner layer 110 that does not contain the ion-containing region 118A remains positioned between the bottom surface 118X of the ion-containing region 118A and the upper surface 106S of the fins 106B, 106C.

Figure 2H:
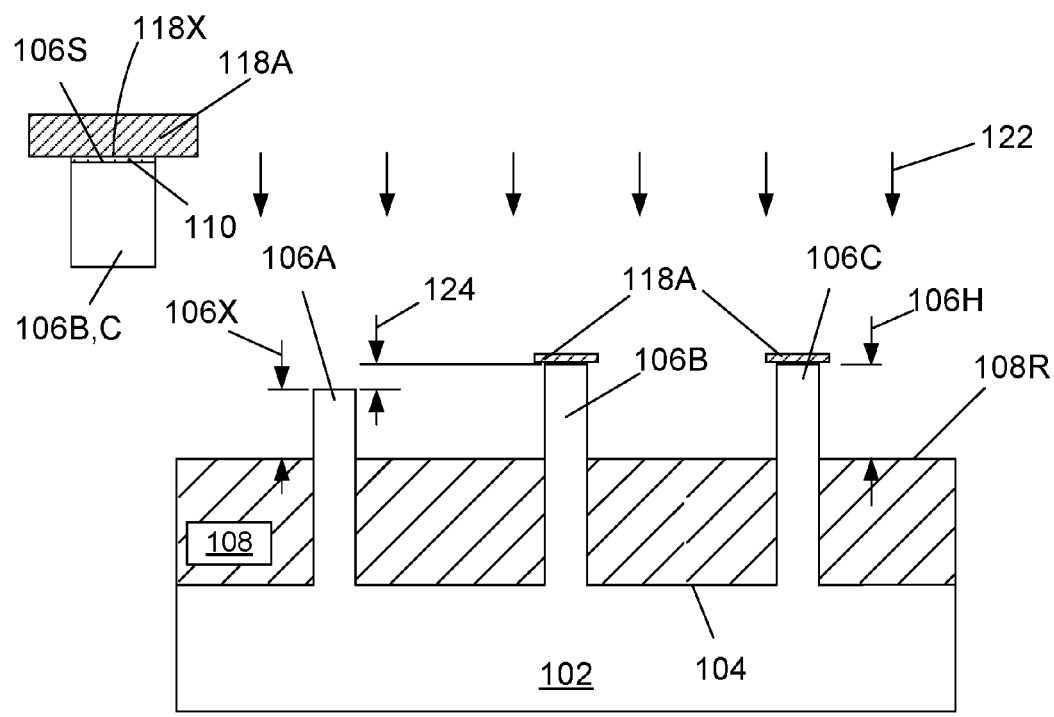

FIG. 2H depicts the product 100 after a timed etching process 122, such as an anisotropic etching (RIE) process, was performed to selectively remove a portion of the vertical height of the fin 106A, while at least the upper surfaces of the fins 106B, 106C are protected during the etching process 122 by the portions of the liner layer 110 positioned above the upper surfaces 106S of the fins 106B, 106C that comprise the ion-containing regions 118A. As depicted, using the methods disclosed herein, after the completion of the etching process 122, the fin 106A has a reduced fin height 106X that is less than the original fin height 106H of the three original fins 106 by a distance 124. The magnitude of the distance 124 may vary depending upon the particular application and the desired reduction of the height of the fin 106A, e.g., in one illustrative example, the distance 124 may be about 1-4 nm. Also note that, after the completion of the etching process 122, the initial height 106H of the fins 106B, 106C remains substantially unchanged.

Figure 2I:
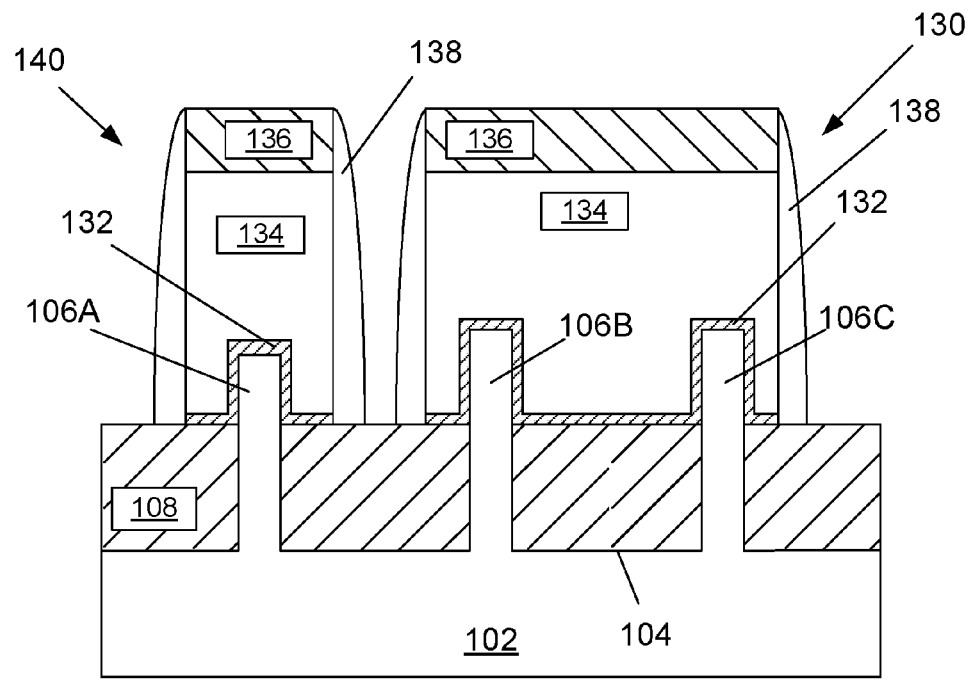

After the completion of the etching process 122 shown in FIG. 2H, to the extent portions of the liner layer 110 remain above the fins 106B, 106C, they may be removed by performing a brief cleaning process. At this point, traditional manufacturing techniques may be performed to complete the formation of the product 100. Accordingly, FIG. 2I depicts the product 100 at a point in fabrication wherein two illustrative FinFET devices 130, 140 have been formed on the product. Each of the devices 130, 140 comprises an illustrative gate insulation layer 132, a gate electrode 134, a gate cap 136 and a sidewall spacer 138. The only difference between the devices (other than the number of fins) is that the fin height 106X of the fin 106A in the device 140 is less than the fin height 106H of the fins 106B, 106C in the device 130. Accordingly, the device 130 (with the taller fins 106B, 106C) will have a threshold voltage that is less than the threshold voltage of the device 140 (with the shorter fin 106A). In general, in one example, simulations indicate that for every 1 nm of height difference (i.e., the distance 124) between the fin 106A and the fins 106B, 106C, there will be a corresponding difference in the threshold voltage levels of the devices 130, 140 of about 10 mV, i.e., for such a one nanometer height difference 124, the device 130 (with the taller fins 106B, 106C) will have a threshold voltage that is about 10 mV less than the threshold voltage of the device 140 (with the shorter fin 106A).

The methods disclosed herein may be employed in cases where the gate structure of the devices 130, 140 is manufactured using any desired technique, e.g., using so-called "gate first" or "replacement gate" manufacturing techniques. By way of illustration only, the gate insulation layer 132 may be a thermally grown layer of silicon dioxide or a high-k (k value greater than 10) material while the gate electrode 134 may be comprised of a material such as polysilicon or amorphous silicon or one or more layers of metal. The gate cap layer 136 and the sidewall spacer 138 may be made of a material such as silicon nitride.

As will be appreciated by those skilled in the art after a complete reading of the present application, the novel methods disclosed herein provide a means for controlling or adjusting the final fin height of FinFET devices which provides, among other things, a means by which the threshold voltage levels of different FinFET devices may be tuned to desired threshold voltage levels.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a first and a second fin in a semiconductor substrate, said first fin having a first upper surface and an initial first height, said second fin having a second upper surface and an initial second height;
    forming a liner layer around at least a portion of each of said first and second fins, a first portion of said liner layer being positioned above said first upper surface of said first fin, a second portion of said liner layer being positioned above said second upper surface of said second fin;
    forming an ion-containing region in said first portion of said liner layer while not forming said ion-containing region in said second portion of said liner layer;
    performing a liner etching process on said first and second portions of said liner layer so as to remove said second portion of said liner layer while leaving at least a portion of said first portion of said liner layer positioned above said first upper surface of said first fin; and
    with said first portion of said liner layer positioned above said first upper surface of said first fin, performing at least one etching process to define a reduced-height second fin that has a reduced second height that is less than said initial first height of said first fin.

2. The method of claim 1, wherein forming said ion-containing region comprises performing an ion implantation process.

3. The method of claim 1, wherein forming said ion-containing region comprises performing a plasma-based process so as to introduce ions into said first portion of said liner layer.

4. The method of claim 1, wherein forming said ion-containing region comprises forming said ion-containing region such that said ion-containing region has a concentration of introduced ions of about $4 \times 10^2$ ion/cm$^3$.

5. The method of claim 4, wherein said introduced ions comprise one of silicon, carbon, germanium, fluorine or chlorine.

6. The method of claim 1, wherein the presence of said ion-containing region in said first portion of said liner layer causes said first portion of said liner layer to have a slower etch rate than that of said second portion of said liner layer.

7. The method of claim 1, wherein forming said ion-containing region in at least a portion of said first portion of said liner layer while not forming said ion-containing region in said second portion of said liner layer comprises:
   forming a masking layer that exposes said first portion of said liner layer while masking said second portion of said liner layer; and
   with said masking layer in position, performing at least one ion introduction process operation to form said ion-containing region in at least a portion of said exposed first portion of said liner layer.

8. The method of claim 1, wherein forming said liner layer around at least a portion of each of said first and second fins comprises forming said liner layer on and in contact with said first upper surface of said first fin, on and in contact with first opposing sidewalls of said first fin, on and in contact with said second upper surface of said second fin and on and in contact with second opposing sidewalls of said second fin.

9. The method of claim 1, wherein said ion-containing region has a bottom surface that is positioned at a level that is above a level of said first upper surface of said first fin.

10. The method of claim 1, wherein said ion-containing region does not extend into said first fin.

11. The method of claim 1, wherein, after the completion of said at least one etching process, said initial first height of said first fin remains unchanged.

12. The method of claim 1, wherein said initial first height, said initial second height and said reduced second height are each measured relative to an upper surface of a layer of insulating material, wherein said upper surface of said layer of insulating material is positioned at a level that is below a level of said first upper surface and said second upper surface.

13. The method of claim 1, wherein said initial first height and said initial second height are substantially the same after forming said first and second fins.

14. A method, comprising:
   forming a first and a second fin in a semiconductor substrate, said first fin having a first upper surface and an initial first height, said second fin having a second upper surface and an initial second height, wherein said initial first height and said initial second height are substantially the same after forming said first and second fins;
   forming a liner layer around at least a portion of each of said first and second fins, a first portion of said liner layer being positioned above said first upper surface of said first fin, a second portion of said liner layer being positioned above said second upper surface of said second fin;
   forming an ion-containing region in said first portion of said liner layer while not forming said ion-containing region in said second portion of said liner layer, wherein said ion-containing region has a bottom surface that is positioned at a level that is above a level of said first upper surface of said first fin;
   performing a liner etching process on said first and second portions of said liner layer so as to remove said second portion of said liner layer while leaving at least a portion of said first portion of said liner layer positioned above said first upper surface of said first fin; and
   with said first portion of said liner layer positioned above said first upper surface of said first fin, performing at least one etching process to define a reduced-height second fin that has a reduced second height that is less than said initial first height and wherein, after the completion of said at least one etching process, said initial first height of said first fin remains unchanged.

15. The method of claim 14, wherein forming said ion-containing region comprises performing an ion implantation process.

16. The method of claim 14, wherein forming said ion-containing region comprises performing a plasma-based process so as to introduce ions into said first portion of said liner layer.

17. The method of claim 14, wherein forming said ion-containing region comprises forming said ion-containing region such that said ion-containing region has a concentration of introduced ions of about $4 \times 10^2$ ion/cm$^3$.

18. The method of claim 14, wherein the presence of said ion-containing region in said first portion of said liner layer causes said first portion of said liner layer to have a slower etch rate than that of said second portion of said liner layer.

19. The method of claim 14, wherein forming said liner layer around at least a portion of each of said first and second fins comprises forming said liner layer on and in contact with said first upper surface of said first fin, on and in contact with first opposing sidewalls of said first fin, on and in contact with said second upper surface of said second fin and on and in contact with second opposing sidewalls of said second fin.

20. The method of claim 14, wherein said ion-containing region does not extend into said first fin.

21. The method of claim 14, wherein said initial first height, said initial second height and said reduced second height are each measured relative to an upper surface of a layer of insulating material, wherein said upper surface of said layer of insulating material is positioned at a level that is below a level of said first upper surface and said second upper surface.

22. A method, comprising:
   forming a first and a second fin in a semiconductor substrate, said first fin having a first upper surface and an initial first height, said second fin having a second upper surface and an initial second height, wherein said initial first height and said initial second height are substantially the same after forming said first and second fins;
   performing a conformal deposition process to deposit a liner layer on and in contact with said first upper surface of said first fin, on and in contact with first opposing sidewalls of said first fin, on and in contact with said second upper surface of said second fin and on and in contact with second opposing sidewalls of said second fin, a first portion of said liner layer being positioned above said first upper surface of said first fin, a second portion of said liner layer being positioned above said second upper surface of said second fin;
   forming an ion-containing region in said first portion of said liner layer while not forming said ion-containing region in said second portion of said liner layer, wherein said ion-containing region has a bottom surface that is positioned at a level that is above a level of said first upper surface of said first fin and wherein the presence of said ion-containing region in said first portion of said liner layer causes said first portion of said liner layer to have a slower etch rate than that of said second portion of said liner layer;

performing a liner etching process on said first and second portions of said liner layer so as to remove said second portion of said liner layer while leaving at least a portion of said first portion of said liner layer positioned above said first upper surface of said first fin; and with said first portion of said liner layer positioned above said first upper surface of said first fin, performing at least one etching process to define a reduced-height second fin that has a reduced second height that is less than said initial first height and wherein, after the completion of said at least one etching process, said initial first height of said first fin remains unchanged.

23. The method of claim 22, wherein said liner layer comprises one of silicon dioxide, silicon nitride or silicon oxynitride.

* * * * *